(12) United States Patent
Englisch

(10) Patent No.: US 6,596,552 B2
(45) Date of Patent: *Jul. 22, 2003

(54) TEST PHOTOMASK AND METHOD FOR INVESTIGATING ESD-INDUCED RETICLE DEFECTS

(75) Inventor: Andreas Englisch, Hamburg (DE)

(73) Assignee: DuPont Photomasks, Inc., Round Rock, TX (US)

( * ) Notice: Subject to any disclaimer, the term of this patent is extended or adjusted under 35 U.S.C. 154(b) by 28 days.

This patent is subject to a terminal disclaimer.

(21) Appl. No.: 09/874,818

(22) Filed: Jun. 5, 2001

(65) Prior Publication Data

US 2001/0041378 A1 Nov. 15, 2001

Related U.S. Application Data

(63) Continuation of application No. 09/545,145, filed on Apr. 7, 2000, now Pat. No. 6,376,264
(60) Provisional application No. 60/128,537, filed on Apr. 9, 1999.

(51) Int. Cl.[7] .............................. H01L 21/66; G03L 5/00
(52) U.S. Cl. ........................................... 438/14; 430/30
(58) Field of Search .................... 430/5, 30; 438/14, 438/16

(56) References Cited

U.S. PATENT DOCUMENTS

| | | | |
|---|---|---|---|
| 4,440,841 A | 4/1984 | Tabuchi | 430/5 |
| 4,758,094 A | 7/1988 | Wihl et al. | |
| 5,212,541 A | 5/1993 | Bergemont | |
| 5,858,580 A | 1/1999 | Wang et al. | 430/5 |
| 5,989,754 A | 11/1999 | Chen et al. | |
| 6,180,291 B1 * | 1/2001 | Bessy et al. | 430/5 |

FOREIGN PATENT DOCUMENTS

| | | | |
|---|---|---|---|
| JP | 11002893 A | 1/1999 | |
| JP | 11002893 | 1/1999 | G03F/1/08 |

OTHER PUBLICATIONS

J. Montoya, "A Study of the Mechanisms for ESD Damage to Reticles", Apr. 2001, Electronics Packaging Manufacturing, IEEE Transactions on, pp. 78–85.*
IBM Technical Disclosure Bulletin, "Electrostatic Discharge Monitor", IBM Corp. New York, vol. 20 No. 5.*
Press Release, "Two New Products Help Monitor Reticle Quality from Final Manufacturing Inspection Through Photolithography Re–Qualification",—KLA–Tencor Corporation, Mar. 19, 1998.
Wiley & Steinman, "Ultrapure Materials–Reticles: Investigating a New Generation of ESD–Induced Reticle Defects", micromagazine.com, Canon Communication LLC., p. 35, Apr. 1999.
Photronics, Inc., "Photomask Basics"; <http://www.photronics.com/internet/corpcomm/photo101/photo101x.htm>, Printed Mar. 24, 1999.
PCT Search Report PCT/US 00/09233, Aug. 10, 2000.
IBM Technical Disclosure Bulletin, "Electrostatic Discharge Monitor", IBM Corp. New York, vol 30, No. 5, Oct. 1, 1987.
Alpay, et al., *Film Stress and Geometry Effects in Chrome Photomask Cleaning Damage.* SPIE vol. 3236, pp. 76–81, Sep. 19, 1979.
IBM Technical Disclosure Bulletin, "Electrostatic Discharge Monitor", IBM Corp. New York, vol 30, No. 5, Oct. 1, 1987.
PCT Written Opinion PCT/US 00/09233, Aug. 3, 1901.

* cited by examiner

*Primary Examiner*—Evan Pert
(74) *Attorney, Agent, or Firm*—Baker Botts L.L.P.

(57) ABSTRACT

A method and apparatus for monitoring and evaluating effects of electrostatic discharge associated with semiconductor manufacturing are disclosed. The method may include, for example, exposing a test photomask that contains an ESD sensitive geometry to a single or a variety of semiconductor manufacturing procedures. The test photomask may be analyzed to determine how much, if any, degradation of its geometry has occurred as a result of the exposure.

11 Claims, 4 Drawing Sheets

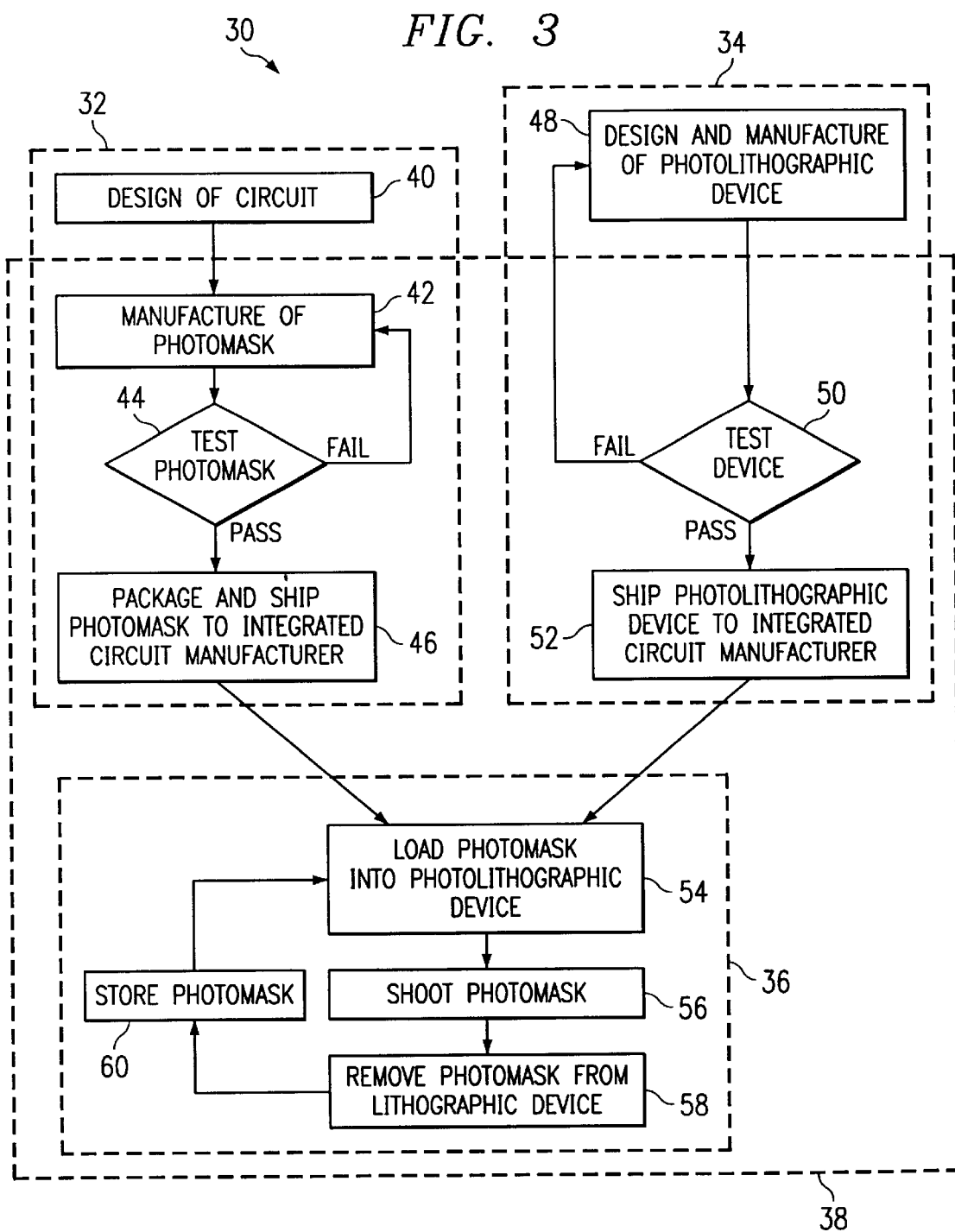

TEST PHOTOMASK AND METHOD FOR INVESTIGATING ESD-INDUCED RETICLE DEFECTS

CROSS REFERENCE TO RELATED APPLICATIONS

This application is a continuation from U.S. patent application Ser. No. 09/545,145, filed by Andreas Englisch on Apr. 7, 2000 and entitled "Test Photomask and Method for Investigating ESD-Induced Reticle Defects" now U.S. Pat. No. 6,376,264 that claims the benefit of U.S. Provisional Application Serial No. 60/128,537 filed by Andreas Englisch on Apr. 9, 1999 entitled "Method and Apparatus for Monitoring Electrostatic Discharge Effects".

TECHNICAL FIELD OF THE INVENTION

This invention relates in general to the field of semiconductor manufacturing and, more particularly, to a method and apparatus for monitoring and evaluating effects of electrostatic discharge associated with semiconductor manufacturing.

BACKGROUND OF THE INVENTION

The manufacturing of complex semiconductor devices involves a series of processes including deposition, photolithography and etching. During the photolithography process, semiconductor manufacturers often use a photomask to copy an image of an electronic circuit onto a semiconductor wafer. Photomasks come in various sizes and shapes such as 1× and 2×photomasks or 2×, 2.5×, 4×, and 5×reticles. Reticles are a type of photomask that can be shot several times onto a single wafer with a photolithographic tool known as a stepper or scanner. Photomasks generally include a quartz blank having a patterned metal layer (e.g., chrome) deposited on one surface. This patterned metal layer contains the microscopic image of the electronic circuit, which is frequently referred to as the photomask's geometry.

The quality of this geometry will substantially dictate the quality of the electronic circuits formed on the semiconductor wafers from the photomask. As design rules have moved toward smaller and more dense integrated circuit (IC) devices, the integrity of the photomask geometry has become increasingly important. One key cause of geometry degradation is electrostatic discharge (ESD). ESD is created when a force causes a charge imbalance among a photomask's chrome structures. In the photomask context, effects of ESD include material sputtering and material migration. Instances of these effects can result in the non-functioning of IC devices created from the degraded photomask. As such, an incentive exists for identifying problem photomasks and potential sources of ESD. Unfortunately, given the large number of process steps necessary to create a large scale integrated circuit (IC) device, it is often very difficult to identify and monitor ESD effects throughout the complete manufacturing process. This is especially true when photomask production and photolithographic tool manufacturing are included in the list of semiconductor manufacturing process steps.

One conventional method of testing for ESD damage on wafers is the inclusion of a test die on a reticle. This method retroactively identifies ESD effects. With this method a test die is included among a number of actual dies. The test die contains a simplified geometry that allows for process control and monitoring during wafer fabrication. However, the test die method requires the production of a bad wafer before a problem is detected. Moreover, the simplified test die geometry may not necessarily approximate the design rule to which the actual IC devices are manufactured. In addition, the test die may not provide information about actual reticle quality.

Defect inspection is another conventional method of testing that which focuses more on the photomask. Defect inspection comprises either a die-to-die inspection or die-to-database inspection. In either case, an actual photomask geometry is compared against an ideal photomask geometry. Differences between the actual and the ideal are identified and a determination as to defect severity is made. Again, the inspection method is retroactive in that it identifies bad dies after they have become bad. Moreover, the inspection method requires a costly device operable to compare the actual geometry with the ideal geometry.

A further method includes the taking of electrical field strength measurements while a photomask is stored, being handled, being shot or exposed during a photolithographic process. This is problematic for at least two reasons. First, electrical field strength measurements are not ESD measurements. The strength of an electrical field is merely an indicator of ESD potential. And second, the measurement is only an indicator of the ESD potential associated with the photolithographic process (i.e., an indicator of only one component of the total ESD effects a typical photomask encounters).

SUMMARY OF THE INVENTION

In accordance with teachings of the present invention, a method and apparatus for monitoring and evaluating effects of electrostatic discharge (ESD) associated with semiconductor manufacturing are provided. The disclosed invention provides significant advantages over prior technologies for ESD detection and evaluation.

According to one aspect of the present invention, a test photomask, which may be any variety of photomask (e.g., a reticle), that contains an ESD sensitive geometry may be exposed to a single or a variety of semiconductor manufacturing procedures. The test photomask may also be exposed to various pieces of equipment related to manufacturing semiconductors. After exposure, the test photomask is analyzed to determine how much, if any, degradation of the geometry has occurred as a result of the exposure. An ESD sensitive geometry may be designed in accordance with teachings of the present invention such that it is significantly more sensitive to ESD than a typical photomask geometry for producing IC devices. In addition, an ESD sensitive geometry may be formed in accordance with the present invention to accurately relate to various design rules including the design rule to which a specific IC device will be manufactured.

Technical advantages of the present inventions include providing a test photomask containing a highly ESD sensitive geometry. The highly sensitive ESD geometry allows the test photomask to reveal ESD effects in one or more cycles of exposure to a given manufacturing procedure or manufacturing device whereas a photomask used to manufacture IC devices may not reveal similar effects until after hundreds or thousands of exposures.

Further technical advantages of the present invention include providing an ESD sensitive geometry, which may be specifically designed to relate to one or more given design rules for IC manufacturing. The ability to relate to multiple design rules allows a manufacturer to quickly determine to what design rule it can consistently manufacture with its current system.

Additionally, a test photomask incorporating teachings of the present invention may be relatively easy and inexpensive to read and may allow users to identify, monitor and evaluate a single aspect or procedure of a semiconductor manufacturing process which may include the mask shop process. Alternatively, the user may identify, monitor and evaluate the entire process for cumulative ESD effects. This ability allows the user to quickly identify ESD problem areas.

Other technical advantages will be apparent to one of skill in the art from the description, drawings and claims.

BRIEF DESCRIPTION OF THE DRAWINGS

A more complete understanding of the present invention and advantages thereof may be acquired by referring to the following descriptions taken in conjunction with the accompanying drawings, in which like reference numbers indicate like features, and wherein:

FIG. 3 is flow chart depicting various semiconductor manufacturing procedures and identifying potential sources of electrostatic discharge effects that may be monitored and evaluated in accordance with teachings of the present invention.

DETAILED DESCRIPTION OF THE INVENTION

Figure 1:
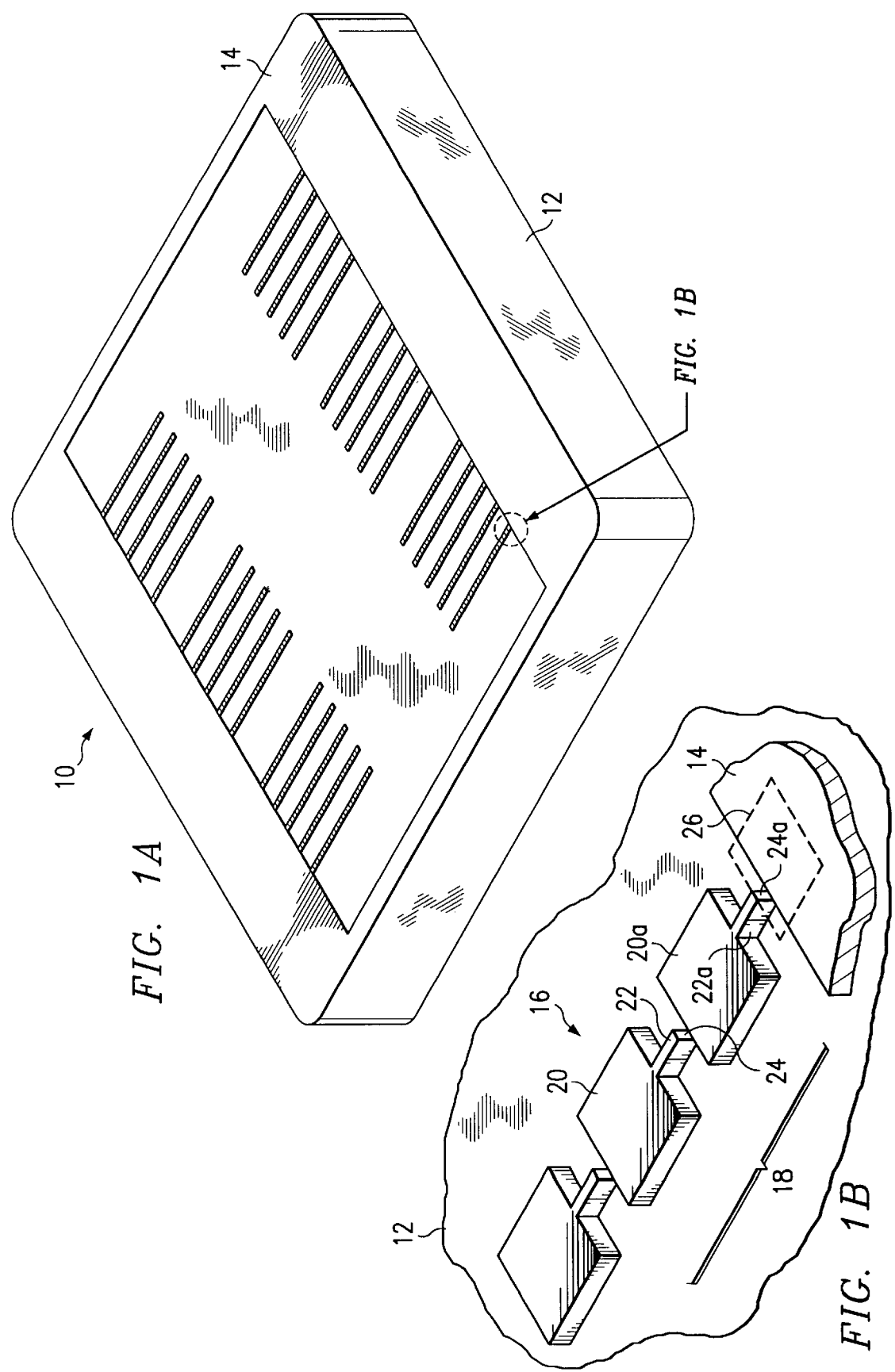
FIGS. 1A and 1B depict a perspective view of one embodiment of an apparatus for monitoring and evaluating severity of electrostatic discharge effects in accordance with teachings of the present invention.

FIGS. 1A and 1B depict a perspective view of one embodiment of an apparatus, indicated generally at 10, for monitoring and evaluating severity of electrostatic discharge effects according to the present invention. The depicted embodiment of apparatus 10 is a reticle. Reticles are types of photomasks that may be shot once or several times onto a single wafer with a photolithographic tool known as a stepper or scanner. Apparatus 10 includes a substrate 12, which may be made from many materials including quartz or glass. One embodiment of an electrostatic discharge (ESD) sensitive geometry, indicated generally at 16, is formed on apparatus 10. Geometry 16 may be formed in a number of ways. For example, geometry 16 can be etched into a metallic layer such as a chrome layer that is associated with substrate 12.

ESD sensitive geometry 16 preferably includes a test module pattern, indicated generally at 18, and a chrome border 14, formed on a surface of apparatus 10. As shown in FIG. 1B, test module pattern 18 includes bodies 20, 20a, and 26, lines 22 and 22a, and gaps 24 and 24a. It should be noted that body 26 comprises a portion of chrome border 14. The number of test modules, their configuration and size may be varied in accordance with teachings of the present invention to monitor, evaluate, and scale ESD and its effects.

Figure 2:
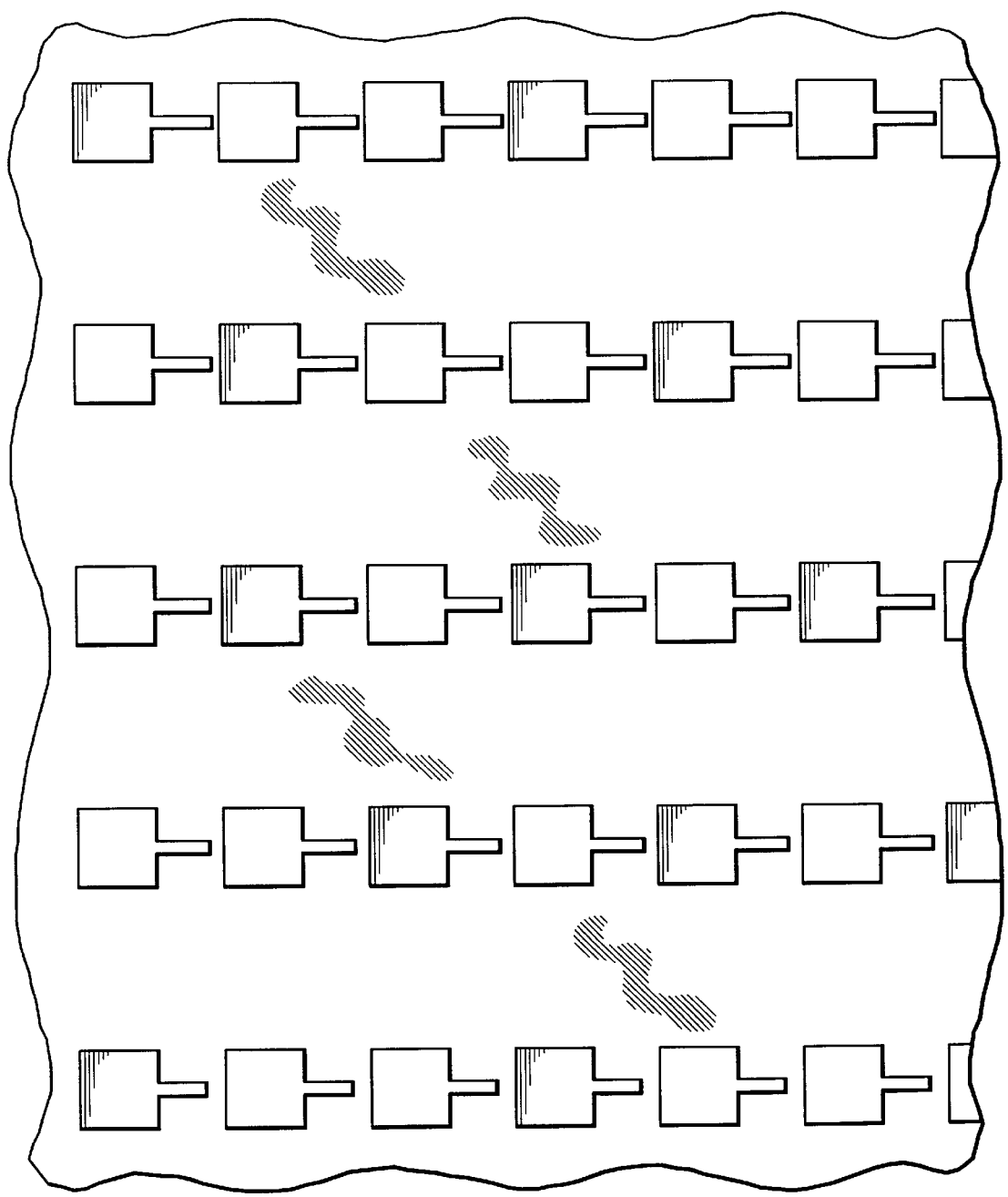
FIG. 2 shows a top view of another embodiment of an apparatus for monitoring and evaluating severity of electrostatic discharge in accordance with teachings of the present invention.

Though a photomask for ESD testing formed in accordance with teachings of the present invention may have various dimensions, the embodiment represented by apparatus 10 is a six inch by six inch test reticle that includes six groups of test module strings. As depicted in FIG. 1A, each group of test module strings includes five strings. An example five string group may be seen more clearly in FIG. 2. Though FIGS. 1A, 1B, and 2 depict five string groups, the number of strings within a group and the number of groups on a reticle may be varied.

In addition to varying the number of groups and/or strings within a group, the dimensions of a test module's element, for example, those depicted in test module 18 may be varied. For example, body 20 may be an approximately one mm by one mm chrome structure of generally square configuration, line 22 may have a length of approximately 200 $\mu$m and a width of approximately 2.5 $\mu$m, and gap 24 defined by the distance between line 20 and body 20a may have a width of approximately 1.5 $\mu$m. All of these dimensions can be varied in order to improve ESD testing for a given semiconductor manufacturing process and a desired design rule. The following ranges indicate different dimensions that have been tested. It should be clear that other dimensions, including dimensions that are either larger or smaller than those listed, may be used. Body dimensions ranging from approximately 0.1 mm by 0.1 mm to 4 mm by 4 mm have been tested. Line lengths ranging from approximately 0.2 mm to 0.5 mm have also been tested. Gap widths ranging from approximately 15 $\mu$m to 1.5 $\mu$m have been tested.

It should be noted that a single test reticle could include a plurality of test modules and that the various included test modules could have bodies, lines and gaps of differing dimensions. In fact, a string of test modules may be more sensitive to ESD than a single test module. As such, it may be desirable to create a string of modules (e.g., 15, 20 or 25 modules) extending from the chrome border.

As mentioned above, a single test reticle could include many such strings. Among the strings and/or within a single string, the body, line and gap dimensions could be varied to provide specific ESD testing for a semiconductor manufacturing process.

For example, six sets of five strings, with each string including twenty-five test modules could be included in an ESD sensitive geometry. A similar configuration is depicted in FIG. 2, which is a top view of another embodiment of an apparatus incorporating teachings of the present invention. The five strings of FIG. 2 may be virtually identical and may provide multiple locations for ESD incidents and may help ensure statistically relevant results.

Moreover, the test modules of the FIG. 2 embodiment may be distributed to cover all portions of the testing surface. With test modules covering all portions of testing surface, the embodiment of FIG. 2 may test its four quadrants independently separated from each other by a 5 mm wide glass gap, which may allow, for example, the testing of individual grounding pads on a photolithographic tool or any other local ESD variation. The accuracy of ground pad testing may be improved by spacing a line of test modules or test module string approximately 5 mm apart from another test module string. The six sets also allow for monitoring and evaluating several possible ESD events at the same time. The gap and/or line dimensions may differ between the five strings that make up each set. This variation helps define critical dimensions and design rules. By including gap dimensions of 1.5 $\mu$m, 2.0 $\mu$m, 2.5 $\mu$m. 3.0 $\mu$m and 4.0 $\mu$m and using a line width of 2.5 $\mu$m, a semiconductor manufacturer will be able to test its processes to determine which design rule it could effectively manufacture. If the test reticle indicates failures at sites with a gap width of 1.5 µm and a line width of 2.5 µm, the manufacturer knows that, approximately, a 0.3 µm design rule may suffer from ESD (may be unobtainable) with its current system. Conversely, if the test reticle indicates no failures at sites with a gap width of 2.5 µm and a line width of 2.5 µm, the manufacturer can probably manufacture to a 0.5 µm design rule without being ESD endangered by effects which are indicated by this test reticle.

Determining whether a test photomask indicates failure may involve two primary steps: (1) exposure to a charge inducing event or apparatus, which can include handling or grounding of the test reticle; and (2) analyzing the test reticle to determine the severity of geometry degradation, which can indicate the severity of electrostatic discharge. The exposure step can include exposure to a single event or apparatus or exposure to a series of events and/or apparatuses.

The analyzing step can involve the use of a microscope. Using a microscope has benefits and drawbacks. The benefits are primarily that the results are determined quickly and at a relatively low cost. The primary drawbacks are accuracy problems and inherent subjectivity problems (the test would most likely be performed by a human operator). A second alternative may be to perform a STARlight test, a photomask analyzing technique provided by KLA-Tencor. STARlight testing is an automated testing procedure that indicates differences in optical behavior of the test reticle and particularly the chrome that makes up the test reticle geometry.

FIG. 3 is flow chart depicting various semiconductor manufacturing procedures and identifying some potential sources of electrostatic discharge effects 38, which may be identified and monitored in accordance with teachings of the present invention. A typical semiconductor manufacturing procedure, indicated generally at 30, includes photomask manufacturing steps 32, photolithographic tool manufacturing steps 34 and IC device manufacturing 36. Many of the steps associated with photomask, photolithographic device and IC device manufacturing are potential sources of ESD and, as such, potential causes of photomask geometry degradation.

The design step 40 wherein an electrical circuit to be included in an IC device is designed is the input data for photomask manufacturing. Once designed, the circuit is etched onto a blank during the process of manufacturing a photomask 42. This process usually involves etching a blank. The etching typically results in a photomask having a geometry defined in part by a chrome layer. The etching and the handling associated with the etching may be charge inducing. Once etched, the photomask is tested to ensure that its geometry accurately represents the desired circuit. This testing step 44 can result in a failing photomask, which either forces the manufacturer to repair the photomask or to scrap it and return to step 42 where another photomask is prepared. Again, this testing and handling can be charge inducing and promote ESD. If the photomask passes its test, it is packaged and sent to an IC device manufacturer where its geometry will be shot onto semiconductor wafers (not expressly shown). This shipping step 46 often entails a great deal of handling, which may be further charge inducing.

An often forgotten source of ESD resides in the photolithographic tool which may be a stepper, stocker, cleaner etc. and in the steps associated with its manufacture. More precisely, the photolithographic tool, itself, may be inherently conducive to ESD. At the outset, a photolithographic tool is designed and manufactured. This step is indicated at 48. The tool is tested to ensure proper operation, indicated at 50. One important test that should and often is not performed on the photolithographic tool is an ESD test. Before a photolithographic tool is shipped to an IC device manufacturer (step 52), it should be tested at step 50 to ensure that it is not conducive to ESD and that its charge inducing characteristics are acceptable.

When the IC device manufacturer secures both a photomask and a photolithographic device, the IC manufacture may load, as indicated at step 54, the photomask into the photolithographic device in order to begin shooting. This loading procedure requires a great deal of handling and, as a result, can be another source of ESD. Similarly, the step of actually shooting the photomask 56 is troublesome. Exposing the photomask to intense energy generated during the shooting process often helps establish the charge separation or electrical potential difference necessary to create ESD. As such, a great many ESD effects are observed when the photomask is removed from the photolithographic tool. The step of removing the photomask 58 involves much handling, which may precipitate occurrences of ESD. Occasionally, handling by a person is not necessary to release the ESD. If the photolithographic device improperly grounds the photomask (e.g., a grounding pad does not function properly), ESD can occur without human contact. In any event, the photomask is typically stored after being shot. This storage step 60 usually involves placing a photomask into a mechanical storage device (e.g., a SMIF pot or any kind of stocker). The storage device in conjunction with the handling necessary to place the photomask within the storage device can and often does result in ESD. Readily apparent from this description of the various procedures associated with manufacturing of semiconductors is the fact that ESD and its causes are present throughout the entire semiconductor manufacturing process. The method and apparatus of the present invention allow for independent ESD testing at each step of the process or collective ESD testing in any selected portion of the process. Both kinds of testing are necessary to identify and monitor ESD effects associated with semiconductor manufacturing. Of the various ESD effects, geometry degradation may be the most detrimental.

Figure 4A:
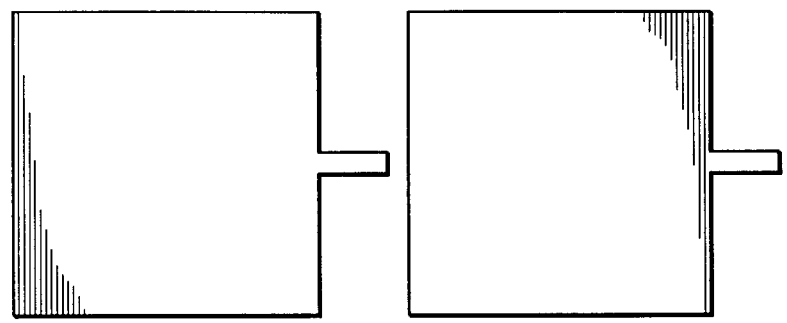
FIGS. 4A, 4B and 4C represent STARlight review results indicating various degrees of electrostatic discharge effects on one embodiment of an apparatus incorporating teachings of the present invention.
Figure 4B:
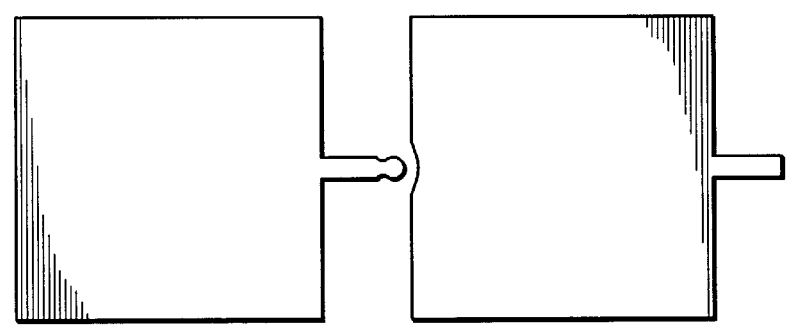
Figure 4C:
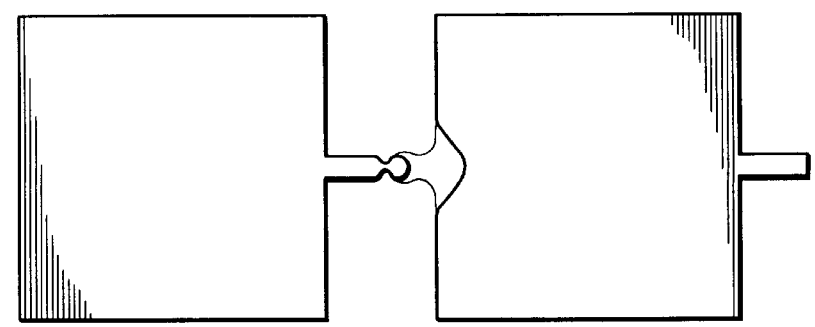

FIGS. 4A, 4B and 4c represent review results indicating various degrees of electrostatic discharge effects on one embodiment of an apparatus incorporating teachings of the present invention. In general terms, the most common ESD effects on photomasks include material sputtering and material migration. Basically, the chrome that makes up a photomask's geometry is either deposited where it should not be or is removed where it should be. Material migration is usually more devastating to the functionality of an IC device created from a defective photomask. The potential risk may be high, because this kind of effect can be cumulative. However, material sputtering can also result in complete non-functionality of an IC device. Material sputtering usually operates between the chrome border and structures in the scribe lane. In this area of a device, elements may be around 10 µm apart, and 10 µm approximates the scatter free distance for electrons in air.

As depicted in FIG. 4A, there is limited if any visible effect from electrostatic discharge. The effects begin to appear in FIG. 4B and are clearly apparent in FIG. 4C.

The apparatus of the present invention is extremely sensitive to ESD and will yield defects like well before a typical photomask. In fact, the high sensitivity provided by the present invention allows the test photomask's geometry to reveal ESD effects in one or more cycles of exposure to a given manufacturing procedure or piece of equipment whereas the IC manufacturer's photomask may not reveal similar effects until after hundreds or thousands of exposures.

Moreover, the ESD sensitive geometry of the test photomask can be designed to relate to whatever design rule the IC manufacturer is manufacturing. When dealing with extremely small design rules, ESD effects are exaggerated (i.e., device functionality affecting defects will more readily occur). Embodiments of the present invention allow a manufacturer to quickly determine how small and how consistently the manufacturer can manufacture with its current system without ESD effects. The number of modules which generate the high sensitivity, may also provide a scale to measure the relative change of ESD risk. A calibration of this scale is in preparation. In preferred embodiments, this scale may be calibrated.

Additionally, given the ease and relatively low costs of monitoring and evaluating the test photomask, a user can narrowly test a single aspect or procedure of its manufacturing process. Alternatively, the user can test the entire process for cumulative ESD effects. This capacity allows the manufacturer to monitor its procedures and to identify ESD problem areas.

Although the present invention has been described in detail, it should be understood that various changes, substitutions and alterations can be made thereto without departing from the sphere and scope of the invention as defined by the appended claims.

What is claimed is:

1. A method for monitoring electrostatic discharge effects, comprising:
    grounding at least a portion of a test photomask including an electrostatic discharge (ESD) geometry formed thereon with a grounding pad located in a photolithographic tool, the ESD geometry including a plurality of test module strings;
    removing the test photomask from the photo lithographic tool; and
    analyzing the test photomask to determine the severity of any ESD effects associated with the photolithographic tool.

2. The method of claim 1, further comprising each test module string spaced approximately five millimeters from an adjacent test module string.

3. The method of claim 2, further comprising the test module strings including a plurality of test module patterns, the test module patterns including a plurality of bodies, lines and gaps.

4. The method of claim 3, further comprising the bodies, lines and gaps in each test module pattern including different dimensions operable to identify a minimum design rule associated with manufacturing integrated circuit devices.

5. The method of claim 1, wherein analyzing the test photomask comprises simultaneously evaluating ESD effects associated with each of the plurality of test module strings.

6. A method for monitoring electrostatic discharge effects, comprising
    grounding at least a portion of a test photomask including an electrostatic discharge (ESD) sensitive risk scale geometry formed thereon with a grounding pad located in a photolithographic tool;
    removing the test photomask from the photolithographic tool; and
    analyzing the test photomask to determine the severity of any ESD effects associated with the photolithographic tool.

7. The method of claim 6, further comprising the ESD sensitive risk scale geometry including a plurality of test module strings.

8. The method of claim 7, further comprising each test module string spaced approximately five millimeters from an adjacent test module string.

9. The method of claim 7, further comprising arranging the plurality of test module strings in a two-dimensional array.

10. The method of claim 7, further comprising the test module strings including a plurality of test module patterns, the test module patterns including a plurality of bodies, lines and gaps.

11. The method of claim 7, further comprising the bodies, lines and gaps in each test module pattern including different dimensions operable to identify a minimum design rule associated with manufacturing integrated circuit devices.

* * * * *